United States Patent
Emoto et al.

(10) Patent No.: US 8,487,393 B2
(45) Date of Patent: Jul. 16, 2013

(54) B-SIALON PHOSPHOR, USE THEREOF AND METHOD FOR PRODUCING SAME

(75) Inventors: Hideyuki Emoto, Machida (JP); Toshiaki Nagumo, Machida (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 86 days.

(21) Appl. No.: 13/125,228

(22) PCT Filed: Jun. 4, 2010

(86) PCT No.: PCT/JP2010/059508
§ 371 (c)(1),
(2), (4) Date: Apr. 20, 2011

(87) PCT Pub. No.: WO2010/143590
PCT Pub. Date: Dec. 16, 2010

(65) Prior Publication Data
US 2011/0198656 A1  Aug. 18, 2011

(30) Foreign Application Priority Data
Jun. 9, 2009 (JP) .................................. 2009-138524

(51) Int. Cl.
*H01L 33/00* (2010.01)
(52) U.S. Cl.
USPC .......................................... 257/432; 257/98
(58) Field of Classification Search
USPC ...... 257/59–72, 431–464, E21.001, E31.003, 257/88–103, E33.072
See application file for complete search history.

(56) References Cited

U.S. PATENT DOCUMENTS

| | | | |
|---|---|---|---|
| 2007/0108896 A1 | 5/2007 | Hirosaki | |
| 2008/0297031 A1 | 12/2008 | Takahashi et al. | |
| 2009/0050845 A1* | 2/2009 | Hirosaki et al. | ........ 252/301.4 F |
| 2009/0140205 A1 | 6/2009 | Kijima et al. | |
| 2010/0053932 A1 | 3/2010 | Emoto et al. | |

FOREIGN PATENT DOCUMENTS

| | | |
|---|---|---|
| EP | 1 964 905 A1 | 9/2008 |
| JP | 2005-255895 | 9/2005 |
| WO | WO 2006/121083 A1 | 11/2006 |
| WO | WO 2007/066733 A1 | 6/2007 |
| WO | WO 2008/062781 A1 | 5/2008 |
| WO | WO 2009/048150 A1 | 4/2009 |

OTHER PUBLICATIONS

European Search Report dated Jun. 19, 2012, issued in corresponding European Patent Application No. 10780121.3-1218 / 2365047 PCT/JP2010059508.
International Search Report issued in International Application No. PCT/JP2010/059508 mailed on Jun. 29, 2010.

* cited by examiner

*Primary Examiner* — Cuong Q Nguyen
(74) *Attorney, Agent, or Firm* — Stein IP, LLC

(57) ABSTRACT

An Eu-activated β-sialon phosphor showing a high luminance, the use thereof and the method of producing the same. The β-sialon phosphor includes, as a matrix, a β-sialon crystal represented by a general formula: $Si_{6-z}Al_zO_zN_{8-z}$ (0<z<4.2), wherein Eu, which serves as an activator, is solid-soluted in the β-sialon crystal, and the ratio of $Eu^{2+}/(Eu^{2+}+Eu^{3+})$ is 0.8 or more. It is preferred that the amount of Eu in the solid solution is 0.1 to 1 mass % with respect to the mass of the β-sialon crystal.

14 Claims, 2 Drawing Sheets

B-SIALON PHOSPHOR, USE THEREOF AND METHOD FOR PRODUCING SAME

CROSS-REFERENCE TO RELATED APPLICATIONS

This application claims the benefit of PCT International Patent Application No. PCT/JP2010/059508, filed Jun. 4, 2010, and Japanese Patent Application No. 2009-138524, filed Jun. 9, 2009, in the Japanese Patent Office, the disclosures of which are incorporated herein by reference.

BACKGROUND OF THE INVENTION

1. Field of the Invention

Aspects of the present invention relate to a β-sialon phosphor which can be used for a light-emitting device such as a white light-emitting LED (white LED) using a blue light-emitting LED (Light Emitting Diode) or an ultraviolet light-emitting LED (ultraviolet LED), the use thereof and the method for producing the same.

2. Description of the Related Art

Nowadays, along with the increase of the output of a white LED, the phosphor used for the white LED has been demanded to have a higher heat resistance and durability. A phosphor having, as a matrix, nitride or oxynitride which has a strong covalent character, has been receiving attention because such phosphor has small luminance change against temperature increase, and is excellent in durability.

Among nitride and oxynitride phosphors, Eu-ion activated β-sialon has been tried to be put to practical use, because it can be excited by light in a wide range of wavelength from ultraviolet light to visible light, and emits green light having a peak in a wavelength range of 520 to 545 nm, and thus is useful for a white LED (Patent Documents 1, 2). However, the luminance is not necessarily sufficient.

PRIOR ART REFERENCES

Patent Document

Patent Document 1: JP-A-2005-255895
Patent Document 2: International Publication WO2006/121083 pamphlet

SUMMARY OF THE INVENTION

Problems to be Solved by the Inventions

An aspect of the present invention is to provide an Eu-activated β-sialon phosphor showing a high luminance, the use thereof and the method of producing the same.

Means for Solving the Problems

The inventors have conducted a research on a β-sialon phosphor containing Eu, focusing on the state of Eu therein, and as a result, found that not all of Eu existing in the raw material is solid-soluted in β-sialon during a calcination process, and Eu has two ionic states, Eu2+ and Eu3+ and the state is influenced by the manufacturing conditions, and in addition, found that when the ratio of Eu2+ exceeds a certain value, the luminance is enhanced, to reach the present invention.

A β-sialon phosphor of an aspect of the present invention includes, as a matrix, a β-sialon crystal represented by a general formula: $Si_{6-z}Al_zO_zN_{8-z}$ (0<z<4.2), wherein Eu, which serves as an activator, is solid-soluted in the β-sialon crystal, and the ratio of Eu2+/(Eu2++Eu3+) is 0.8 or more.

Hereinafter, various embodiments of the present invention will be exemplified. Various embodiments shown below may be combined each other.

It is preferred that the amount of Eu in the solid solution is 0.1 to 1 mass % with respect to the mass of the β-sialon crystal.

It is preferred that the β-sialon crystal is contained in an amount of 90 mass % or more.

Another aspect of the present invention provides a light-emitting device including an LED, and a phosphor layer deposited on a light-emitting side of the LED, wherein the phosphor layer contains the above-mentioned β-sialon phosphor.

Still another aspect of the present invention provides an illumination device having the above-mentioned light-emitting device.

Furthermore, still another aspect of the present invention provides a method of manufacturing a β-sialon phosphor including a calcinating step for calcinating a raw material mixture of the above-mentioned β-sialon phosphor under nitrogen atmosphere at a temperature of 1820° C. to 2200° C. to obtain a calcinated product, and an annealing step for annealing the calcinated product under a reducing atmosphere at a temperature of 1100° C. or more.

It is preferred that the raw material mixture contains silicon nitride, aluminum nitride, and an Eu-containing compound.

It is preferred that the raw material mixture further contains at least one of silicon oxide and aluminum oxide.

It is preferred that the reducing atmosphere is an atmosphere of hydrogen gas only, or a mixed gas containing a noble gas and hydrogen gas.

It is preferred that the noble gas is argon gas.

It is preferred that the reducing atmosphere is a mixed gas containing a noble gas and hydrogen gas, and the atmosphere contains hydrogen gas in an amount of 1% or more and less than 100%.

It is preferred that the annealing step is performed at a temperature of 1500° C. or less.

It is preferred that the method of manufacturing a β-sialon phosphor further includes an acid-treating step for acid-treating the calcinated product.

It is preferred that the acid-treating step is performed by immersing and heating the calcinated product in a mixed acid consisting of hydrofluoric acid and nitric acid.

It is preferred that the heating is performed in the mixed acid at a temperature of 50° C. to 80° C.

Effect of the Invention

A β-sialon phosphor according to an aspect of the present invention can be excited by light in a wide range of wavelength from ultraviolet light to visible light, and emits green light in high fluorescence emission efficiency, and thus is excellent as green phosphor. This β-sialon phosphor exhibits small luminance change with respect to change in usage environment, and can be used for various light-emitting devices, especially a white LED having an ultraviolet LED or a blue LED as a light source, singly or in combination with other phosphors.

DESCRIPTION OF THE PREFERRED EMBODIMENTS

Figure 1:
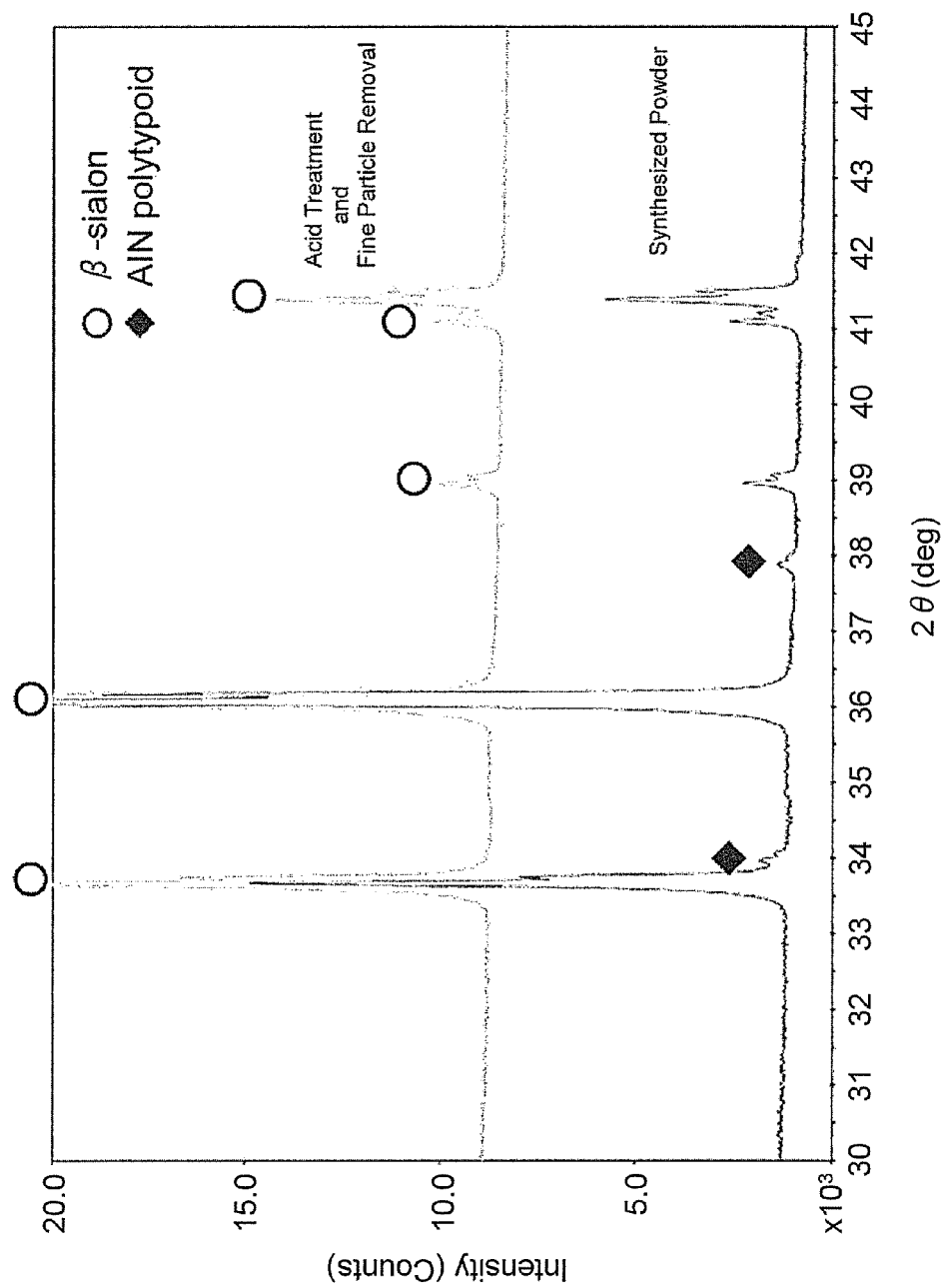
FIG. 1 An explanation drawing showing X-ray diffraction patterns of synthesized powder, and powder after acid-treatment and fine powder removal in Comparative Example 1.
Figure 2:
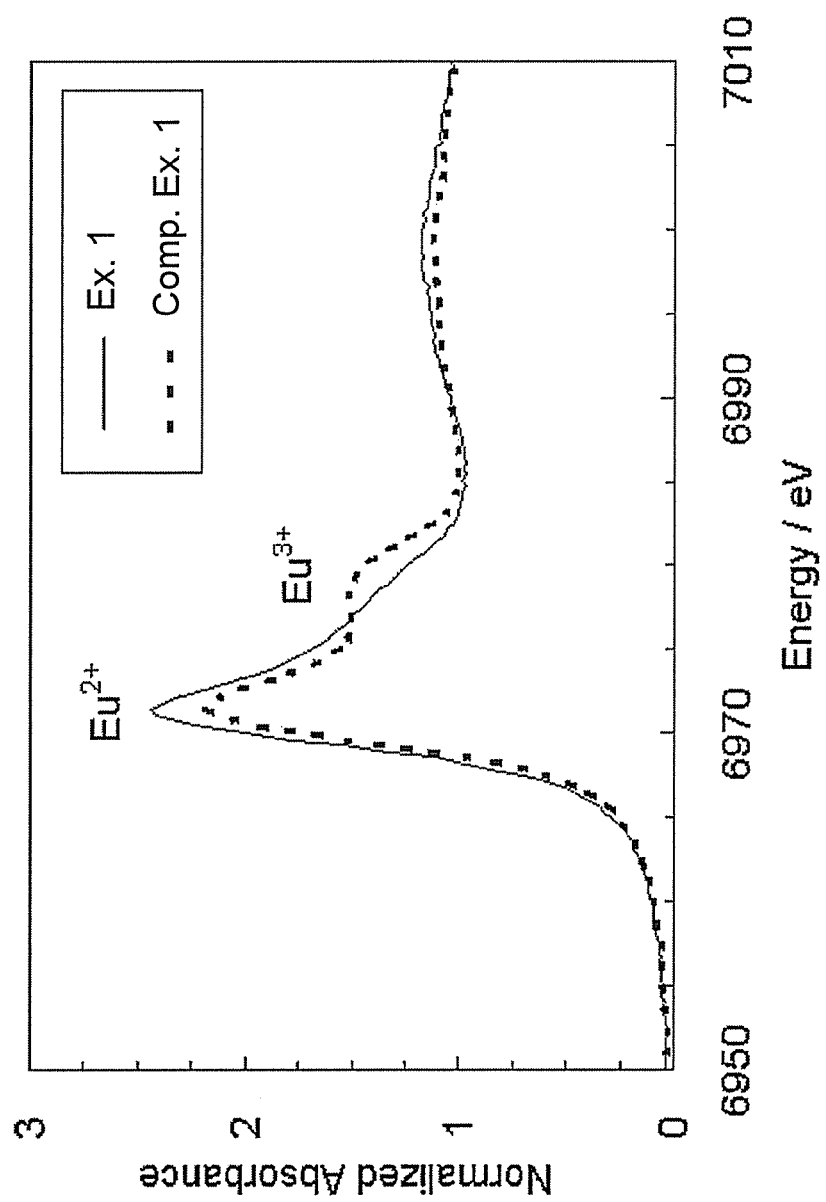
FIG. 2 An explanation drawing showing XANES spectra of phosphors obtained in Example 1 and Comparative Example 1.

A β-sialon phosphor according to one embodiment of the present invention includes, as a matrix, a β-sialon crystal represented by a general formula: $Si_{6-z}Al_zO_zN_{8-z}$ ($0<z<4.2$), wherein Eu, which serves as an activator, is solid-soluted in the β-sialon crystal, and the ratio of $Eu^{2+}/(Eu^{2+}+Eu^{3+})$ is 0.8 or more.

The β-sialon crystal has a general formula: $Si_{6-z}Al_zO_zN_{8-z}$ ($0<z<4.2$). The value of z is, for example, 0.1, 0.5, 1, 1.5, 2, 2.5, 3, 3.5, 4, 4.1, and may be in the range of any two selected from the values exemplified here.

Eu present in the β-sialon phosphor exists as $Eu^{2+}$ or $Eu^{3+}$ ion. The ratio of $Eu^{2+}/(Eu^{2+}+Eu^{3+})$ is required to be 0.8 or more because the higher ratio of $Eu^{2+}$ is more preferable. $Eu^{3+}$ present in the β-sialon phosphor does not contribute to the fluorescence emission at all. Therefore, the ratio of $Eu^{2+}$ and $Eu^{3+}$ is 0.8 or more as the value of $Eu^{2+}/Eu^{2+}+Eu^{3+}$, and the upper limit is 1 in the theoretical value. The ratio of the amount of $Eu^{2+}$ can be adjusted by adjusting the annealing temperature, the retention time, and the reductivity of the atmosphere. $Eu^{2+}/(Eu^{2+}+Eu^{3+})$ is 0.8 to 1, and specifically 0.8, 0.81, 0.82, 0.83, 0.84, 0.85, 0.86, 0.88, 0.9, 0.95, 0.99, 1. $Eu^{2+}/(Eu^{2+}+Eu^{3+})$ may be in the range of any two selected from the values exemplified here.

The ratio of $Eu^{2+}$ and $Eu^{3+}$ can be quantified, for example, by measuring the Eu L3-edge XANES spectrum. XANES is an acronym of X-ray Absorption Near Edge Structure (X-ray absorption near edge fine structure), and is a kind of an analysis method of X-ray absorption fine structure (XAFS) measurement methods. It is known that strong absorption peak energy which appears in L3-edge XANES spectrum of a rare-earth element is determined by the valency of the rare-earth, and in the case of Eu, the peak for $Eu^{2+}$ appears around 6970 eV, and the peak for $Eu^{3+}$ appears around 6980 eV, and therefore the ratio can be quantified by separating these two.

The β-sialon phosphor can be obtained, for example, by calcinating a mixture consisting of silicon nitride powder, aluminum nitride powder, europium oxide powder and/or as necessary silicon or aluminum oxide under nitrogen atmosphere at high temperature. Soon after the initiation of the heating, the oxides existing in the system (including a surface oxidation layer of nitride powder) reacts to form a liquid phase, and each constituent element diffuses via the liquid phase to form a β-sialon crystal, and the grain growth develops. When the β-sialon crystal is synthesized from a composition near the β-sialon crystal in the above-mentioned raw material system, a minute amount of AlN polytypoid which is a layered compound having a structure similar to AlN is produced as a by-product of the β-sialon crystal. In other words, the β-sialon phosphor obtained by the above-mentioned method includes the β-sialon crystal and the AlN polytypoid. Eu, which is an activator, is solid-soluted also in the AlN polytypoid, which is a by-product.

According to the inventors' consideration, Eu is solid-soluted to the AlN polytypoid with higher priority than to the β-sialon crystal, and therefore, the Eu concentration actually solid-soluted in the β-sialon crystal is lower than the Eu concentration designed in the raw material composition. In order to determine the Eu amount actually solid-soluted in the β-sialon crystal, removal of the second phase (a phase other than the β-sialon crystal) was tried. As the result, it was found that AlN polytypoid containing Eu can be removed by acid treatment or the like under specific conditions. Specifically, when the synthesized powder of the β-sialon phosphor is heat-treated in a mixed acid consisting of hydrofluoric acid and nitric acid, most of the AlN polytypoid is dissolved into the acid, and a part of the AlN polytypoid precipitate as submicron-sized fluoride or oxyfluoride. This fluoride or oxyfluoride can be easily removed by sedimentation separation or the like because the particle diameter is substantially different from that of the β-sialon crystal particles. By this treatment, the amount of Eu contained in the synthesized powder of the β-sialon phosphor is reduced by 10 to 40%, fluorescence property is hardly changed. That is, whether or not the AlN polytypoid exists does not influence the property of the β-sialon phosphor.

The amount of Eu solid-soluted in the β-sialon crystal can be measured by removing the second phase from the β-sialon phosphor by the above-mentioned method. In the present embodiment, this Eu solid-soluted amount is, preferably, 0.1 to 1 mass %, and more preferably 0.3 to 1 mass %, with respect to the mass of the β-sialon crystal. When the Eu solid-soluted amount is smaller than 0.1 mass %, luminance sufficient for the β-sialon phosphor cannot be obtained, and thus not preferable. Furthermore, because Eu is difficult to be solid-soluted in the β-sialon crystal, the solid-soluted amount over 1 mass % practically cannot be obtained. Eu solid-soluted amount is, for example, 0.1, 0.2, 0.3, 0.35, 0.4, 0.45, 0.5, 0.55, 0.6, 0.7, 0.8, 0.9, 1.0 mass %. This Eu solid-soluted amount may be in the range of any two selected from the values exemplified here.

In view of fluorescence emission, the β-sialon phosphor of the present embodiment is preferred to include the above-mentioned β-sialon crystal in high purity as much as possible, and if possible, is preferred to be made of a single phase. However, it may be a mixture containing moderate amount of unavoidable amorphous phase and another crystal phase as long as the property does not deteriorate. According to the inventors' consideration, it is preferred that the β-sialon phosphor of the present embodiment contains the β-sialon crystal in an amount of 90 mass % or more. Conversely, when the content of the β-sialon crystal is less than 90 mass %, fluorescence emission property drops, and thus it is not preferred.

Next, a method of obtaining the β-sialon phosphor of the present embodiment will be explained.

As the raw material, for example, silicon nitride ($Si_3N_4$), aluminum nitride (AlN), and an Eu compound selected from Eu metal, oxide, carbonate, nitride or oxynitride are used. These are mixed so as to obtain a predetermined β-sialon phosphor composition after the reaction. In preparing the mixture, the amount of oxide contained in the silicon nitride powder or aluminum nitride powder needs to be considered. Silicon oxide ($SiO_2$) and/or aluminum oxide ($Al_2O_3$) may be mixed in the raw material. Compounds or simple substances used for the raw material are not limited to those shown here. For example, as a silicon source of the raw material, metal silicon only, or a mixture of metal silicon and silicon nitride may be used.

A dry blending method, or a method of wet-blending components of the raw material in an inactive solvent, followed by removal of the solvent may be employed to mix the above-mentioned starting materials. As a blending device, a V-mixer, a rocking mixer, a ball mill, a vibration mill or the like may be advantageously used.

The above-mentioned raw material mixed powder is filled into a container of a crucible or the like. At least the surface, of the container, contacting the raw material is made of boron nitride. Then, the raw material mixed powder is heated under nitrogen atmosphere to advance solid-solution reaction in the raw material powder to obtain the β-sialon phosphor.

The temperature under nitrogen atmosphere can vary dependent on the composition, and thus cannot be uniformly determined, but in general, is preferred to be 1820° C. or more and 2200° C. or less. When the temperature under nitrogen atmosphere is too low, there is a tendency that Eu cannot be solid-soluted in the crystal structure of the β-sialon phosphor. When the temperature is too high, very high nitrogen pressure is required to suppress decomposition of the raw material and the β-sialon phosphor, and thus it is industrially not preferred.

The β-sialon phosphor after the solid-solution reaction is in a massive form. The β-sialon phosphor can be applied to various uses by cracking, crushing and sometimes classifying the β-sialon phosphor to obtain powder with a predetermined size. It is preferred that the average particle diameter is made to be 6 to 30 μm for an appropriate use as a phosphor for a white LED. In the present specification, "average particle diameter" means a particle diameter at a volume integrated value of 50% in the particle size distribution determined by a laser diffraction and scattering method.

Specific examples to make the average particle diameter to be 6 to 30 μm are a method of classifying the massive β-sialon phosphor by use of a sieve with each aperture of approx. 45 μm, and transfer, to a subsequent step, the powder which has passed through the sieve, or a method of crushing the massive β-sialon phosphor to a predetermined particle size by use of a common crusher such as a ball mill, a vibration mill, or a jet mill.

According to a method of manufacturing the β-sialon phosphor of the present embodiment, the ratio of $Eu^{2+}$ in Eu solid-soluted in the β-sialon crystal is increased by annealing the β-sialon phosphor containing Eu, which is synthesized by the method exemplified above, under a reducing atmosphere at a temperature of 1100° C. or more. The reducing atmosphere means, for example, an atmosphere of a reducing gas only, or a mixed gas containing a noble gas and a reducing gas. The noble gas is, for example, a gas of a Group 18 element such as argon, helium or the like. The reducing gas is, for example, a gas having reducing power, such as ammonia, hydrocarbon gas, carbon monoxide, hydrogen or the like. As to the mixing ratio of the reducing gas, when the reducing gas is hydrogen, it is preferred that the concentration is 1% or more and less than 100%. This is because, when the concentration is too low, the reducing power is not sufficient. The hydrogen concentration is specifically 99% or less, 90% or less, 50% or less, 20% or less, or 10% or less. In view of explosion prevention, it is preferred that the hydrogen concentration is 4% or less, because 4% is an explosion limit.

When the temperature in the annealing step is lower than 1100° C., change from $Eu^{3+}$ to $Eu^{2+}$ is difficult to occur, and thus it is not preferred. The upper limit of the temperature in the annealing step is not in particular stipulated, but, the temperature is, for example, 1600° C., and approx. 1500° C. When the annealing temperature is too high, β-sialon releases nitrogen and decomposes. The annealing temperature is specifically, for example, 1100, 1150, 1200, 1250, 1300, 1350, 1400, 1450, 1500, 1550, 1600° C., and it may be in the range of any two selected from the values exemplified here.

It is preferred that the processing time of the annealing step is 2 hours or more and 24 hours or less. When the processing time in the annealing step is short, the ratio of $Eu^{2+}$ tends to be small, and when the processing time is long, the ratio of $Eu^{2+}$ tends to be large. However, the effect of the annealing step cannot be further enhanced even when the processing time is extremely long. Therefore, it is preferred that the processing time is 2 hours or more and 24 hours or less, and more preferably 2 hours or more and 8 hours or less. The processing time of the annealing step is, for example, 2, 4, 6, 8, 10, 12, 14, 16, 18, 20, 22, 24 hours, and it may be in the range of any two selected from the values exemplified here.

Furthermore, it is preferred that the β-sialon phosphor after the annealing step is subjected to an acid-treating step. According to this acid treatment, the β-sialon is acid-cleaned, and the fluorescence property is enhanced. As acids used for the acid treatment, one or more acids selected from hydrofluoric acid, sulfuric acid, phosphoric acid, hydrochloric acid, nitric acid are used, and the acids are used in the form of an aqueous solution containing these acids. The main purpose of this acid treatment is to remove decomposed material, generated in the annealing step in an extremely small amount, of the β-sialon crystal. Thus, it is preferred to use a mixed acid consisting of hydrofluoric acid and nitric acid because it is appropriate for removal of this decomposed material. This acid-treating step can be performed by reacting the β-sialon phosphor with the above-mentioned acids through the step of dispersing the β-sialon phosphor into an aqueous solution containing the above-mentioned acids, followed by stirring for several minutes to several hours (e.g. 10 minutes to 3 hours). The acid temperature may be room temperature, and is preferably 50 to 80° C. It is preferred that after the acid treatment, the phosphor particles are separated from the acids by use of a filter or the like, and washed with water.

The β-sialon phosphor of the present embodiment is advantageously used as a material of a phosphor layer of a light-emitting device. One example of the light-emitting device includes an LED, and a phosphor layer deposited on the light-emitting side of the LED. As LEDs of this light-emitting device, an ultraviolet LED or a blue LED which emits light of a wavelength of 350 to 500 nm is preferred, and a blue LED which emits light of a wavelength of 440 to 480 nm is particularly preferred. Furthermore, this light-emitting device can be incorporated in an illumination device. An example of the illumination device is a backlight of a liquid crystal display.

EXAMPLES

Examples according to aspects of the present invention will be explained in detail in comparison with Comparative Examples.

Comparative Example 1

α-silicon nitride powder produced by Ube Industries, Ltd. (SN-E10 grade, oxygen content 1.0 mass %) 95.43 mass %, aluminum nitride powder produced by Tokuyama Corporation (F grade, oxygen content 0.8 mass %) 3.04 mass %, aluminum oxide powder produced by Taimei Chemicals Co., Ltd. (TM-DAR grade) 0.74 mass %, europium oxide powder produced by Shin-Etsu Chemical Co., Ltd. (RU grade) 0.79 mass % were mixed by use of a V-mixer (S-3, produced by Tsutsui Scientific Instruments Co., Ltd.), and were passed through a sieve with each aperture of 250 μm to remove agglomeration. Through this process, raw material mixed powder was obtained. The compounding ratio here was designed so as to achieve z=0.25 in a general formula of β-sialon: $Si_{6-z}Al_zO_zN_{8-z}$ except europium oxide.

The raw material mixed powder obtained here was filled in a cylindrical container with a lid, made of boron nitride (N-1 grade, produced by Denki Kagaku Kogyo Kabushiki Kaisha), and was heat-treated for 12 hours at a temperature of 2000° C. under nitrogen atmosphere at a pressure of 0.8 MPa in an electric furnace of a carbon heater. The raw material mixed powder becomes a loosely-agglomerated mass after the heat treatment. The mass was loosen and slightly crushed, and then passed through a sieve with each aperture of 45 µm. The powder which passed through the sieve was acid-treated by immersing the powder in a 1:1 mixed acid of 50% hydrofluoric acid and 70% nitric acid for 30 minutes at a temperature of 75° C. The powder after the acid treatment was precipitated, and the supernatant and the fine powder obtained in the acid treatment were removed. Thereafter, a decantation was performed by adding distilled water to the precipitate, stirring and leaving at rest the resultant mixture, and removing the supernatant and the fine powder. The decantation was repeated until the pH of the solution becomes 8 or less and the supernatant becomes transparent. The finally obtained precipitate was filtered and dried to obtain a β-sialon phosphor of Comparative Example 1.

Powder X-ray diffraction measurement (XRD) using a Cu—Kα ray was performed with respect to the β-sialon phosphor before and after the acid treatment. The result was shown in FIG. 1. Diffraction line of AlN polytypoid seen at 2θ=30 to 40° disappeared by the treatment. The Eu content dropped from 0.80 mass % to 0.45 mass % by the acid treatment. The Eu content was measured by use of an ICP emission spectrophotometer "SPECTRO CIROS-120" produced by Rigaku Corporation.

Example 1

The β-sialon phosphor of Comparative Example 1 was filled in a cylindrical container made of boron nitride, and was annealed for 8 hours at a temperature of 1450° C. under an atmosphere of a mixed gas of argon with atmospheric pressure and 4% hydrogen in an electric furnace of a carbon heater. The β-sialon phosphor after the annealing step was acid-treated in the same way as Comparative Example 1. The color of the β-sialon phosphor changed from green to dark-green through the annealing step, and changed to bright green through the acid treatment.

Comparative Example 2

The β-sialon phosphor obtained in Example 1 was filled in an alumina crucible, and annealed at a temperature of 900° C. in the air by use of a muffle furnace. The powder after the annealing was acid-treated in the same way as Comparative Example 1. The color of the β-sialon phosphor changed from green to blue-green through the annealing step, but the color of the powder of the β-sialon phosphor did not change through the acid treatment.

Example 2

The β-sialon phosphor of Comparative Example 1 was filled in a cylindrical container made of boron nitride, and annealed for 8 hours at a temperature of 1450° C. under hydrogen gas atmosphere with atmospheric pressure in an electric furnace of a tungsten heater and whose inside was totally made of metal. The resultant powder was acid-treated in the same way as Comparative Example 1. In this case, the color of the powder changed in the same way as Example 1.

(Evaluation of β-Sialon Phosphor)

The luminance efficiency of the β-sialon phosphor was measured in the following way. A standard reflector with a reflectance of 99% (Spectralon produced by Labsphere) was set in an integrating sphere, and monochromatic light of a wavelength of 455 nm separated from a light source (Xe lamp) was introduced into the integrating sphere by use of an optical fiber.

The standard reflector was irradiated with the monochromatic light, the spectrum of the reflected light was measured by use of a spectrophotometer (MCPD-7000, produced by Otsuka Electronics Co., Ltd.). Next, a cell having a recess filled with the β-sialon phosphor powder was set in the position of the standard reflector, and it was irradiated with the monochromatic light of a wavelength of 455 nm, and the reflectance spectrum and the fluorescence spectrum were measured.

The luminance efficiency was calculated in the following way. An excitation light photon count (Qex) was calculated from the reflectance spectrum of the standard reflector in a wavelength range of 450 to 465 nm. Then, a reflected light photon count (Qref) of the phosphor was calculated in a wavelength range of 450 to 465 nm, and a fluorescence photon count (Qem) was calculated in a range of 465 to 800 nm. The obtained three photon counts were used to calculate external quantum efficiency (Qem/Qex×100), absorptance ((Qex−Qref)×100), internal quantum efficiency (Qem/(Qex−Qref)×100).

The Eu L3-edge XANES spectrum of the β-sialon phosphor was measured by use of an XAFS measurement device mounded on BL11 in Kyushu Synchrotron Light Research Center (SAGA-LS) established by Saga Prefecture. Incident X-ray energy was scanned in a range of 6950 eV to 7020 eV with a gap of about 0.4 eV gap. Incident X-ray strength 10 was measured by use of a 17 cm ionization chamber with a flow of a He/N2=50/50 mixed gas through a transmission method with a cumulative time of 2 seconds per point. Furthermore, transmission X-ray strength I was measured by use of a 31 cm ionization chamber with a flow of N2 gas through a transmission method with a cumulative time of 2 seconds per point.

The obtained Eu L3-edge XANES spectrum was normalized by subtracting the background of the lower energy side of the absorption peak (pre-edge region), and adjusting the strength of the background intensity of the higher energy side of the absorption peak (post-edge region) to 1. A portion corresponding to step-like absorption of the normalized spectrum was modeled by an arctangent function, and peaks corresponding to Eu2+ and Eu3+ of the normalized spectrum were modeled by the Lorenz function in order to perform fitting. XAFS data analysis software "Athena", which is disclosed in the following literature, was used for these analyses.

B. Ravel and M. Newville, J. Synchrotron Rad. (2005), 12, p. 537-541.

An area S [Eu2+] of the Lorenz function corresponding to Eu2+ and an area S [Eu3+] of the Lorenz function corresponding to Eu3+ were obtained as the result of the modeling and fitting of the Eu L3-edge XANES spectrum of the β-sialon phosphor. The ratio of Eu2+ was defined as Eu2+/(Eu2++Eu3+)=S [Eu2+]/(S [Eu2+]+S [Eu3+]).

Table 1 shows the Eu content, the internal quantum efficiency and the external quantum efficiency and the value of Eu2+/(Eu2++Eu3+) with respect to the phosphors of Examples 1 and 2, Comparative Examples 1 and 2. The Eu content was measured by the ICP emission spectroscopic analysis. The internal quantum efficiency and the external quantum efficiency were measured with monochromatic light of a wavelength of 455 nm. The value of Eu2+/(Eu2++Eu3+) was measured by the XANES measurement.

TABLE 1

|  | Eu Content (mass %) | $\frac{Eu^{2+}}{(Eu^{2+}+Eu^{3+})}$ | Internal Quantum Efficiency (%) | External Quantum Efficiency (%) |
|---|---|---|---|---|
| Comp. Ex. 1 | 0.45 | 0.76 | 43.5 | 31.4 |
| Ex. 1 | 0.43 | 0.83 | 74.5 | 51.9 |
| Comp. Ex. 2 | 0.45 | 0.21 | 10.2 | 7.8 |
| Ex. 2 | 0.43 | 0.90 | 82.2 | 58.8 |

The β-sialon phosphors of Examples had higher luminance than those of Comparative Example due to their configuration.

INDUSTRIAL APPLICABILITY

The β-sialon phosphor according to aspects of the present invention can be excited by light in a wide range of wavelength from ultraviolet light to visible light, and emits green light with high luminance. Therefore, this can be used as a phosphor for a white LED having a ultraviolet LED or a blue LED as a light source.

We claim:

1. A β-sialon phosphor comprising, as a matrix, a β-sialon crystal represented by a general formula: $Si_{6-z}Al_zO_zN_{8-z}$ (0<z<4.2), wherein Eu, which serves as an activator, is solid-soluted in the β-sialon crystal in two ionic states, $Eu^{2+}$ and $Eu^{3+}$, and the ratio of $Eu^{2+}/(Eu^{2+}+Eu^{3+})$ is 0.8 or more.

2. The phosphor according to claim 1, wherein the amount of Eu in the solid solution is 0.1 to 1 mass % with respect to the mass of the β-sialon crystal.

3. The phosphor according to claim 1, containing the β-sialon crystal in an amount of 90 mass % or more.

4. A light-emitting device comprising an LED, and a phosphor layer deposited on a light-emitting side of the LED, wherein the phosphor layer contains the β-sialon phosphor according to claim 1.

5. An illumination device having the light-emitting device according to claim 4.

6. A method of manufacturing a β-sialon phosphor comprising a calcinating step for calcinating a raw material mixture of the β-sialon phosphor according to claim 1 under nitrogen atmosphere at a temperature of 1820° C. to 2200° C. to obtain a calcinated product, and an annealing step for annealing the calcinated product under a reducing atmosphere at a temperature of 1100° C. or more, wherein the reducing atmosphere is an atmosphere of a mixed gas containing a noble gas and hydrogen gas.

7. The method of manufacturing a β-sialon phosphor according to claim 6, wherein the raw material mixture contains silicon nitride, aluminum nitride, and an Eu-containing compound.

8. The method of manufacturing a β-sialon phosphor according to claim 7, wherein the raw material mixture further contains at least one of silicon oxide and aluminum oxide.

9. The method of manufacturing a β-sialon phosphor according to claim 6, wherein the noble gas is argon gas.

10. The method of manufacturing a β-sialon phosphor according to claim 6, wherein the reducing atmosphere contains hydrogen gas in an amount of 1% or more and less than 100%.

11. The method of manufacturing a β-sialon phosphor according to claim 6, wherein the annealing step is performed at a temperature of 1500° C. or less.

12. The method of manufacturing a β-sialon phosphor according to claim 6, further comprising an acid-treating step for acid-treating the calcinated product.

13. The method of manufacturing a β-sialon phosphor according to claim 12, wherein the acid-treating step is performed by immersing and heating the calcinated product in a mixed acid consisting of hydrofluoric acid and nitric acid.

14. The method of manufacturing a β-sialon phosphor according to claim 13, wherein the heating is performed in the mixed acid at a temperature of 50° C. to 80° C.

* * * * *